(12) United States Patent
Stovall et al.

(10) Patent No.: US 7,417,233 B2
(45) Date of Patent: Aug. 26, 2008

(54) BEAM EXPOSURE CORRECTION SYSTEM AND METHOD

(75) Inventors: Scott C. Stovall, San Jose, CA (US); Benyamin Buller, Cupertino, CA (US); Jimmy Iskandar, Fremont, CA (US); Ming Lun Yu, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 178 days.

(21) Appl. No.: 11/237,554

(22) Filed: Sep. 28, 2005

(65) Prior Publication Data
US 2007/0069151 A1    Mar. 29, 2007

(51) Int. Cl.
G21K 1/08    (2006.01)
(52) U.S. Cl. .......... 250/396 R; 250/397; 250/398; 250/396 ML; 250/492.22
(58) Field of Classification Search .......... 250/396 R, 250/492.22, 398
See application file for complete search history.

(56) References Cited

U.S. PATENT DOCUMENTS

| | | | |
|---|---|---|---|
| 5,831,273 A * | 11/1998 | Someda et al. ......... | 250/492.22 |
| 5,847,959 A | 12/1998 | Veneklasen et al. .... | 364/468.28 |
| 6,420,717 B1 | 7/2002 | Babin et al. ............. | 250/492.2 |
| 6,521,901 B1 | 2/2003 | Shamoun et al. ........ | 250/492.2 |
| 6,878,950 B2 | 4/2005 | Shamoun et al. ........ | 250/492.2 |
| 2002/0147507 A1 | 10/2002 | Stanton ..................... | 700/30 |
| 2003/0098424 A1 | 5/2003 | Shamoun et al. ........ | 250/492.1 |

* cited by examiner

*Primary Examiner*—Jack I. Berman
*Assistant Examiner*—Andrew Smyth
(74) *Attorney, Agent, or Firm*—Shirley L. Church

(57) ABSTRACT

A system and method of determining shape and position corrections of a beam such as a particle or other beam used in a system such as a particle beam lithography. The method of providing corrected deflector voltages may include determining a voltage step value by subtracting a previous deflector voltage value with a current deflector voltage value; determining a plurality of correction values using the voltage step value and an exposure time for the current deflector voltage value; selecting a current voltage correction value from the plurality of correction values using the current deflector voltage value; and calculating a corrected deflector voltage value by adding the current voltage correction value to the current deflector voltage value.

24 Claims, 4 Drawing Sheets

BEAM EXPOSURE CORRECTION SYSTEM AND METHOD

BACKGROUND OF THE INVENTION

1. Field of the Invention

The present invention relates in general to a system and method for correcting beam exposure during beam shaping and/or beam positioning. It more particularly relates to a method and apparatus for correcting the exposure of a particle beam such as a particle or other beam for use in various applications such as particle beam lithography.

2. Background Art

There is no admission that the background art disclosed in this section legally constitutes prior art.

A typical particle beam lithography device may include a beam column having a series of high speed deflectors. The top set of deflectors is referred to as a blanker and turns on and turns off the beam. The other deflectors may be beam shape deflectors and position deflectors.

The shape deflectors position the beam over a cutting aperture to generate different sizes and shapes of the beam, such as rectangles, triangles, etc. The voltage applied to the shape deflectors may be dependent on the desired size and shape of the beam. The beam column may contain more than one set of shape deflectors and cutting apertures.

The position deflectors such as raster scan and/or vector scan deflectors may position the beam by, for example, applying a directional vector to the shaped beam. The voltage values to the vector deflectors may be different for each different directional vector. Therefore the voltage values to these vector deflectors may be changing for each flash of the beam. Similarly, the beam column may contain more than one set of raster scan and/or vector deflectors.

The lithography device further may include a controller for providing deflector voltages to these deflectors. The controller may include, for example, a digital board having a field programmable gate array (FPGA). The FPGA receives the shape and directional vector codes and converts them into digital words that represent the voltage values for the deflectors. These digital words may be provided to digital to analog converters (DACs). These DACs may include output amplifiers having high slew rates causing significant ringing of the deflector voltage waveform.

The flash rate and lithography accuracy requirements for the next generation beam lithography are much greater than those of previous shaped beam tools. Nominally, shape size and placement accuracy of 1 part in 4000 (or 0.025%) are required. Typically, the raw accuracy of high speed output driven over several feet of cable to an imperfectly terminated deflector may be a few parts per hundred.

To achieve high writing throughput (i.e. high flash rate), it is necessary for at least some applications to unblank the beam before the shape and vector deflection signals have fully settled to their final values. Due to the high rate of the output amplifier and imperfections in the electronics, the settling time may be longer than the blanking time causing the actual deflector voltage to exhibit significant oscillation or ringing.

In the case of the vector deflection signals, this has the effect of causing the exposed flash to "move around" slightly. The position at which the edge resolves is a function of the average deflection voltage during the exposure time of the flash. The ringing may affect the average deflection voltage during the exposure time by causing a blurring of the doping of the resist at the edge of the desired pattern or shape. This blurring may cause a displacement of the dose development threshold on the resist, resulting in an offset position of the shape of the resist. The blur caused by this motion cannot be eliminated in many instances.

A problem can exist when increasing the flash rate to achieve the shape size and placement accuracy required for this generation of beam lithography devices due to the ringing of the deflector voltage signals. A technique is needed for modern high speed, high accuracy beam systems to correct for the ringing of the deflector voltage signals.

BRIEF DESCRIPTION OF THE DRAWINGS

The features of this invention and the manner of attaining them will become apparent, and the invention itself will be best understood by reference to the following description of certain embodiments of the invention taken in conjunction with the accompanying drawings, wherein.

DESCRIPTION OF CERTAIN EMBODIMENTS OF THE INVENTION

Figure 1:
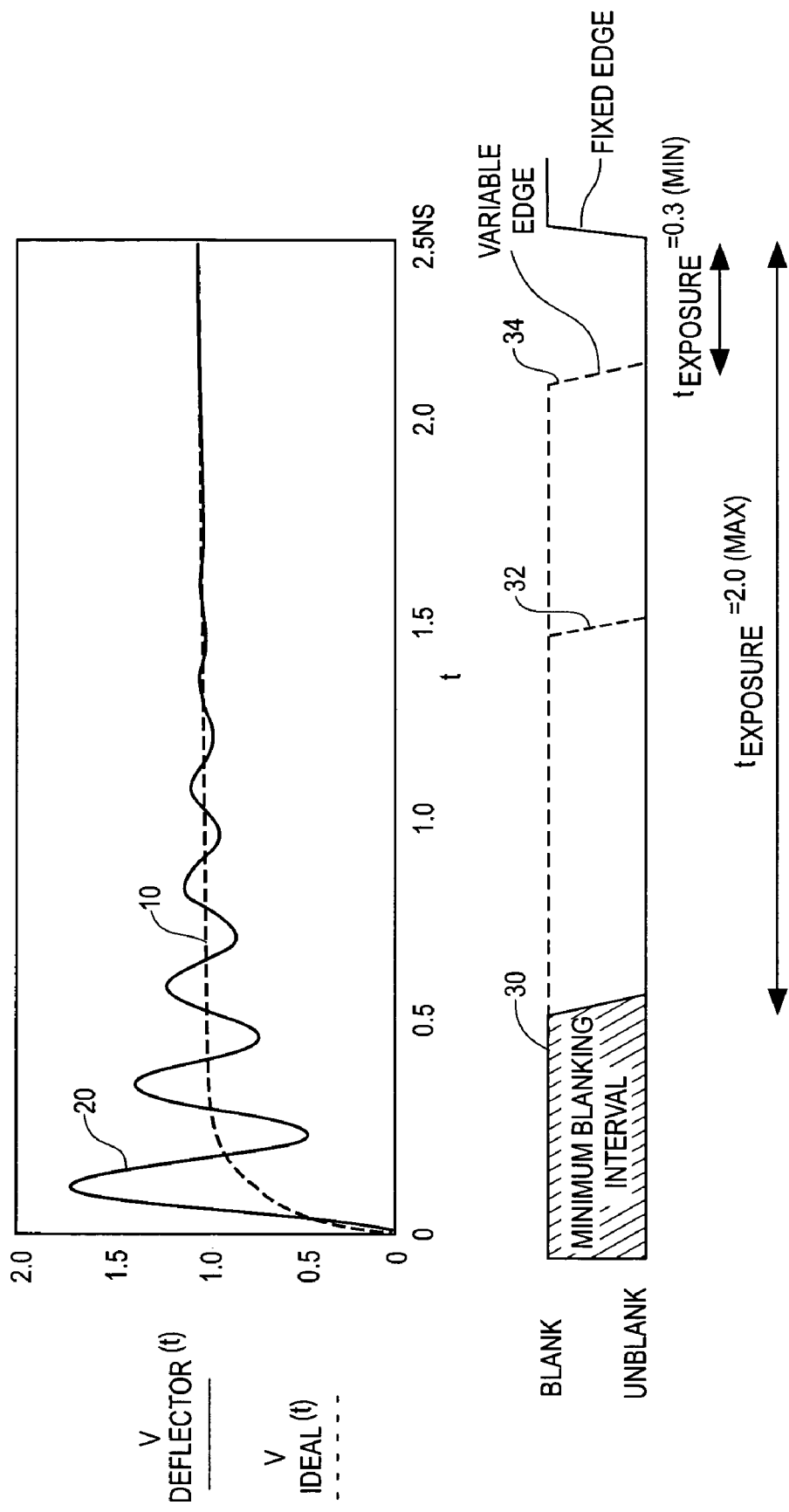
FIG. 1 is a graph of ideal and actual deflector voltages over time including the blanking interval useful in understanding the disclosed embodiments of the invention.

It will be readily understood that the components of the embodiments as generally described and illustrated in the drawings herein, could be arranged and designed in a wide variety of different configurations. Thus, the following more detailed description of the embodiments of the system, components and method of the present invention, as represented in the drawings, is not intended to limit the scope of the invention, as claimed, but is merely representative of the embodiments of the invention.

A system and method are disclosed for determining shape and position corrections of a beam such as a particle or other beam. According to an embodiment of the invention, the disclosed system and method may include determining a correction value using a previous deflector voltage value, a current deflector voltage value, and an exposure time for the current deflector voltage value; and calculating a corrected deflector voltage value by adding the correction value to the current deflector voltage value.

In accordance with another disclosed embodiment of the invention, there is provided a system and method of determining corrected deflector voltages including calculating a voltage step value by subtracting a previous deflector voltage value with a current deflector voltage value; determining a plurality of correction values using the voltage step value and an exposure time for the current deflector voltage value; selecting a current voltage correction value from the plurality of correction values using the current deflector voltage value; and calculating a corrected deflector voltage value by adding the current voltage correction value to the current deflector voltage value.

According to another aspect of a disclosed embodiment of the invention, there is provided a software system and method for providing correction for deflector voltages utilizing a module for determining a correction value using a previous deflector voltage value, a current deflector voltage value, and an exposure time for the current deflector voltage value; and a module for calculating a corrected deflector voltage value by adding the correction value to the current deflector voltage value.

According to yet another aspect of a disclosed embodiment of the invention, there is provided a software system and method for providing correction for deflector voltages utilizing a module for calculating a voltage step value by subtracting a previous deflector voltage value with a current deflector voltage value; a module for determining a plurality of correction values using the voltage step value and an exposure time for the current deflector voltage value; a module for selecting a current voltage correction value from the plurality of correction values using the current deflector voltage value; and a module for calculating a corrected deflector voltage value by adding the current voltage correction value to the current deflector voltage value.

Referring to FIG. 1, there is shown a graph illustrating 400 MHz deflection voltage waveforms. The total period for each waveform may be 2.5 nanoseconds. An ideal deflector voltage waveform 10 may, for example, cleanly transition from 0.0 volts to 1 volt prior to the end of the minimum blanking interval (MBI) 30, which may, for example, be around 0.5 nanoseconds. In reality, due to the high slew rate of an output amplifier and imperfections in the electronics, the actual deflector voltage waveform 20 may exhibit significant ringing or oscillation which continues well beyond the MBI 30 period of time. The actual deflector voltage waveform 20 may require almost three times the MBI 30 to an acceptable level with some ringing still occurring at 2.0 nanoseconds.

The exposure time of the deflection voltage waveforms may vary from a minimum of about 0.3 nanoseconds to a maximum of about 2.0 nanoseconds by adjusting the blanking interval. Therefore, the blanking interval may vary from the minimum of about 0.5 nanoseconds to a maximum of about 2.2 nanoseconds. With a blanking interval 32 of about 1.5 nanoseconds, the exposure time is about 1.0 nanoseconds. With a blanking interval as indicated at 34 of about 2.2 nanoseconds, the exposure time is about 0.3 nanoseconds. For the lower exposure times and higher blanking intervals, the actual deflector voltage waveform 20 may have significantly settled. For the higher exposure times and lower blanking intervals, the actual deflector voltage waveform 20 may exhibit significant ringing or oscillation. In order to use larger shapes and to write faster, the exposure times typically used tend toward the higher times.

Figure 2:
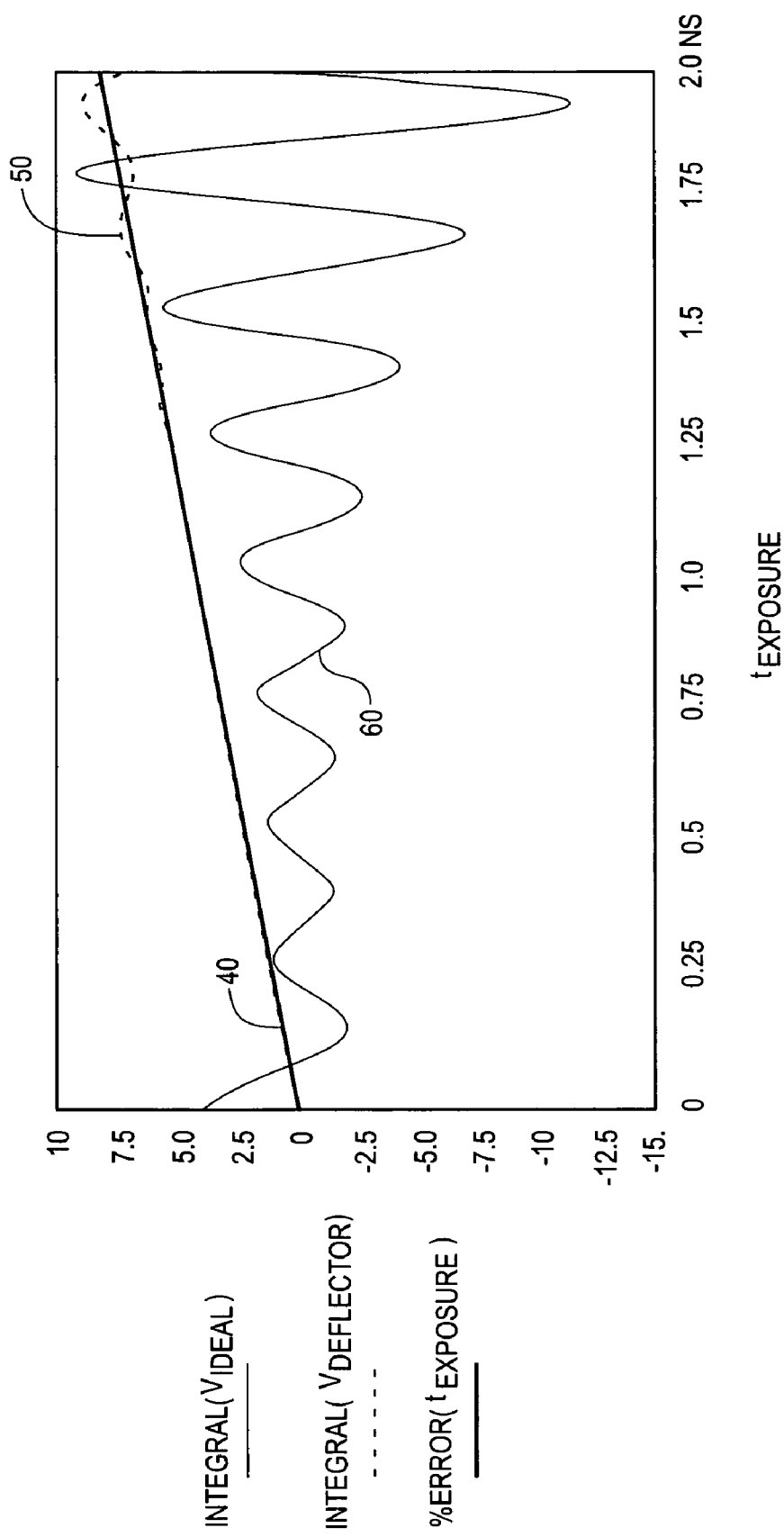
FIG. 2 is a graph of the average signal amplitudes versus exposure time for the deflector voltage signals of FIG. 1 and the percent error versus exposure time.

Referring now to FIG. 2, a graph showing the average signal amplitudes of the waveforms of FIG. 1 versus the exposure time is shown. The ideal average signal amplitude waveform 40 is the integral of the ideal deflector voltage waveform 10 and may be represented as an ideally straight ramp. The actual average signal amplitude waveform 50, shown in broken lines, is the integral of the actual deflector voltage waveform 20 and may generally follow the ramp of waveform 40 including some oscillations whose amplitudes increase as the exposure time increases.

A percentage error waveform 60 represents the percentage error of the actual average signal waveform 40 to the ideal average signal amplitude waveform 40. This percentage error waveform may only be valid for the waveforms of FIG. 1. The percentage error waveform 60 may oscillate indicating the actual average signal amplitude may be greater than or less than the ideal average signal amplitude. Even at the minimum exposure time, correctable error in the actual average signal amplitude may exist. As discussed above, correcting the actual average signal amplitude to the position deflectors such as the vector deflectors, may improve the position error.

As can be seen in FIGS. 1 and 2, the amount of ringing in the deflector voltage and its associated error in the average signal amplitude may be dependent on the exposure time. Furthermore, this ringing and error may also be dependent on both the voltage step or change of the deflector voltage and the voltage range of over which the step transitions. As the size of the voltage step increases, the amount of ringing may increase. For example, one may expect the ringing on a 1 volt step to be about twice that of a 0.5 volt step.

Regarding the voltage range of the step, most high speed amplifiers have the following properties: 1) the amplifier's gain is a function of current and 2) the amplifier's gain-bandwidth product is a function of both current and voltage. Since the ringing may be a function of both the gain and the gain-bandwidth product, the ringing and the error may be dependent on the voltage range of the step.

Figure 3:
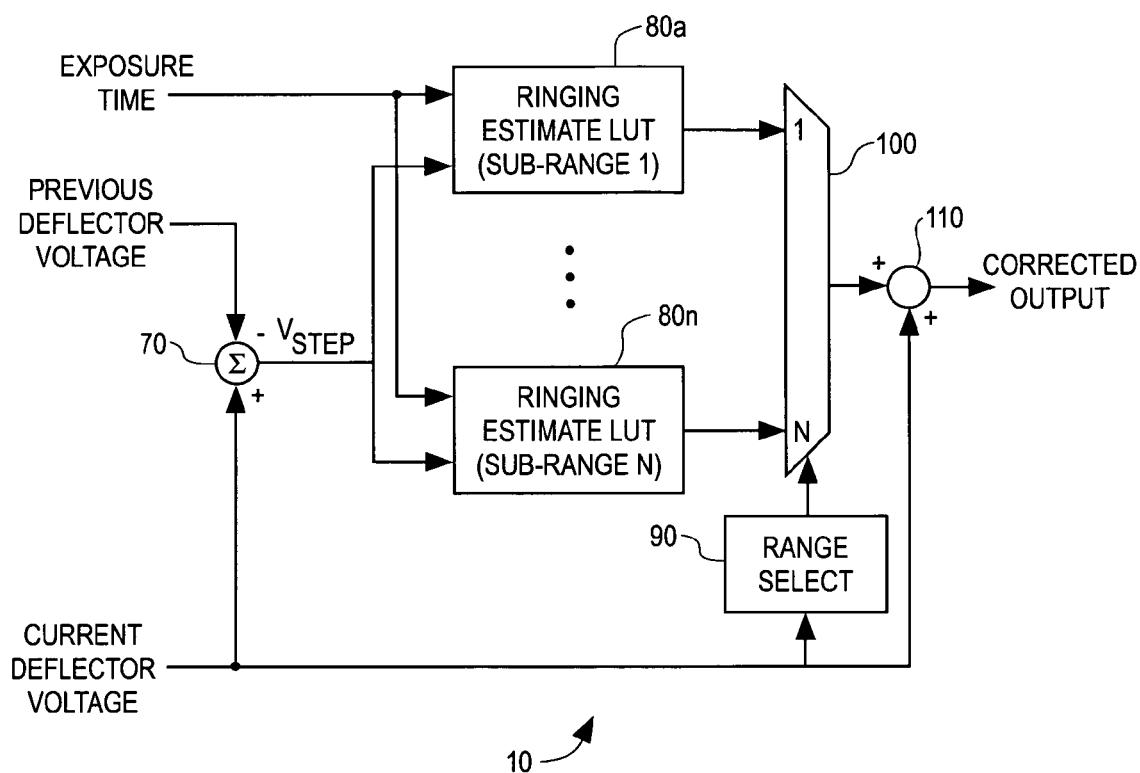
FIG. 3 is a block diagram of a beam exposure correction system according to an embodiment of the present invention.

Referring now to FIG. 3, there is shown a beam exposure correction system 10, which is constructed according to an embodiment of the present invention. The system 100 may be in the form of a correction architecture as shown. The previously discussed digital words from the conventional FPGA may be inputted in this correction architecture system 10, along with the exposure time to generate corrected digital words for inputting into the deflector control DACs (not shown).

The correction architecture system 10 may include a plurality of look-up tables 80a-80n, a range selector 90, a look-up table selector 100, and a pair of summers 70 and 110. Each one of the sub-range look-up tables includes correction information for different deflector voltage values. At summer 70 a previous deflector voltage value may be subtracted from a current deflector voltage value to create a voltage step value at the output of the summer 70. This voltage step value and an exposure time for the current deflector voltage value may be provided to each of the look-up tables 80a-80n. Each look-up table 80a-80n may provide at its output a correction value for a specific voltage range of the deflector. It should be understood that in place of a group of individual sub-range look-up tables, only a single look-up table may be provided.

These correction values from the look-up tables may be provided as inputs to the look-up table selector 100. The current deflector voltage value may be inputted to the range selector 90, which determines the proper voltage range for the current deflector voltage value and selects correction value associated with this voltage range using the look-up table selector 100. The selected correction value may be passed through the look-up table selector 100 and added with the current deflector voltage value at summer 100 to generate a corrected current deflector voltage value. This corrected current deflector voltage value may then be provided to the appropriate DAC (not shown), as discussed previously, to eliminate or greatly reduce ringing during beam exposure.

The correction value may compensate for the ringing in the deflector voltage by adjusting the digital word to the DAC (not shown) so that the average signal amplitude correctly corresponds to the desired deflector voltage. The "movement" of the beam may still be occurring, but the edge resolves correctly since the average signal amplitude has been corrected. Therefore the effects of the ringing may be minimized, or at least greatly reduced for beam shaping and/or beam positioning.

The deflector voltage range may be broken into N sub-ranges depending on the relationship of the deflector voltage level to the ringing or percentage error of the average signal amplitude. N may equal 1 if the sensitivity to the deflector voltage level is insignificant. For each sub-range, the percentage error curves for the voltage steps and exposure time may be determined via calibration. These curves may be scaled versions of the full scale step curve or may be interpolated from some number of partial scale steps. The correction curves may then be loaded into the look-up table associated with that sub-range.

Figure 4:
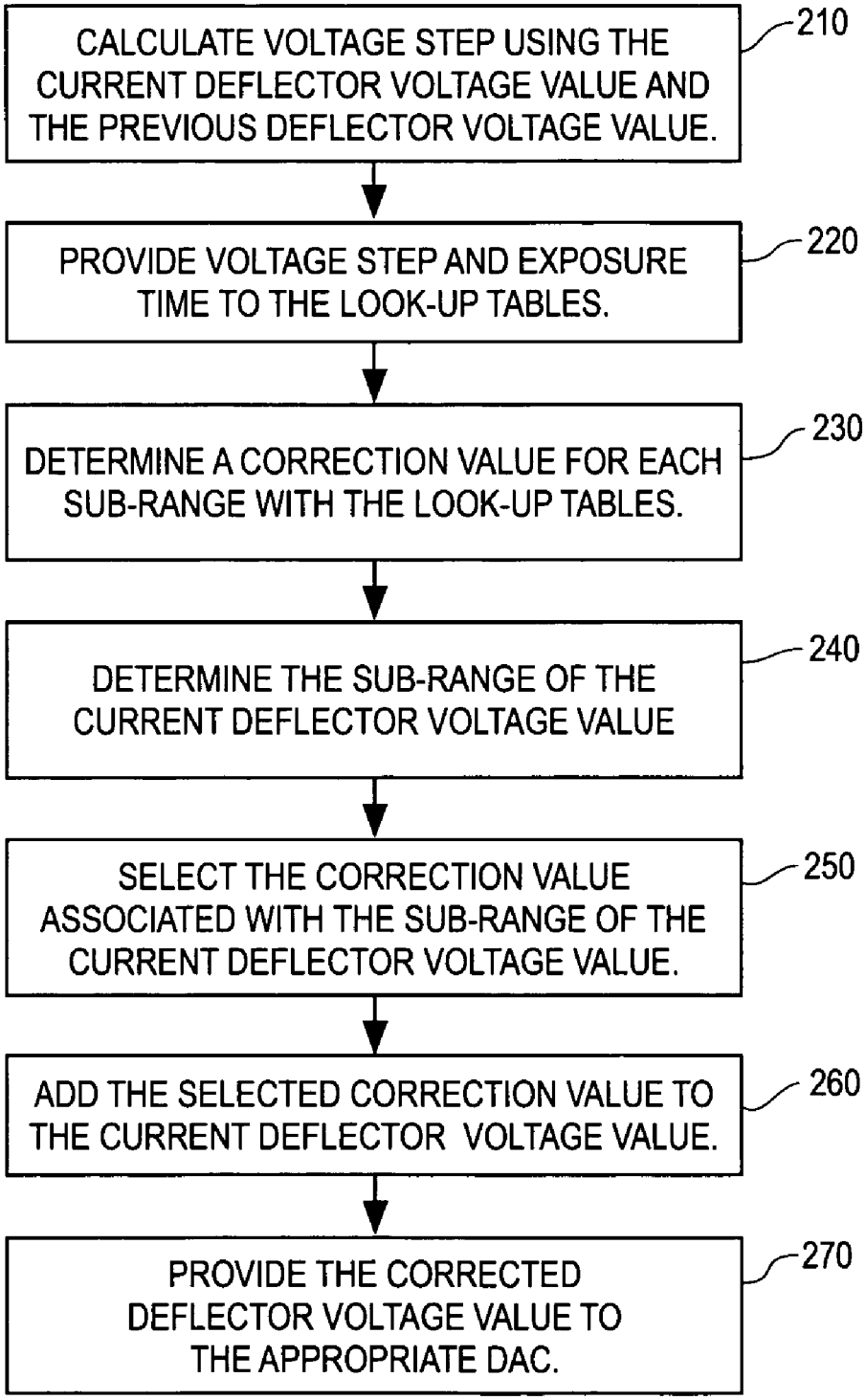
FIG. 4 is a flow chart of an embodiment of a method of beam exposure correction according to an embodiment of the present invention.

Referring now to FIG. 4, an embodiment of a method of making shape and position corrections using writing history and exposure time according to the present invention is shown and referenced as 200. In step 210, the voltage step for the current deflector voltage may be calculated by subtracting the previous deflector voltage value from the current deflector voltage value. Next, the voltage step and the exposure time may be provided as inputs to each of the look-up tables in step 220. Each look-up table may be associated with a specific sub-range of the deflector voltage range and may include correction values or curves in terms of voltage step and exposure time.

In step 230, the correction value associated with the inputted voltage step and exposure time may be provided at the output of each look-up table. The sub-range of the current deflector voltage value may be determined in step 240. In step 250 the correction value associated with the sub-range of the current deflector voltage value may be selected. The selected correction value may be added to the current deflector voltage value in step 260 to create a corrected current deflector voltage value. In step 270, the corrected current deflector voltage value may be provided to the appropriate DAC (not shown) which drives one of the shape or position deflectors (not shown).

This method may be utilized to adjust the deflector voltage for each of the shape and position deflectors (not shown), or for only the shape and/or position deflectors that may be significantly affected by the ringing of their deflector voltages.

As mentioned previously, it is contemplated that the plurality of look-up tables may be replaced with a single large look-up table. Such a look-up table may have inputs of exposure time, previous deflector voltage value, and current deflector voltage value and may have an output of the correction value or the corrected current deflector voltage value.

While particular embodiments of the present invention have been disclosed, it is to be understood that various different embodiments are possible and are contemplated within the true spirit and scope of the appended claims. There is no intention, therefore, of limitations to the exact abstract or disclosure herein presented.

What is claimed is:

1. A method of improving pattern edge resolution during exposure of a photoresist to a particle beam by using a beam exposure correction for deflector voltages, comprising:

determining a correction value using a previous deflector voltage value, a current deflector voltage value, and an exposure time of the current deflector voltage value, wherein the correction value is obtained from look-up tables using the current deflector voltage value as a reference; and determining a corrected deflector voltage value by adding the correction value to the current deflector voltage value.

2. The method of claim 1, wherein the determining a correction value includes calculating the current deflector voltage value.

3. The method of claim 1, further including calculating a voltage step value by subtracting the previous deflector voltage value from the current deflector voltage value.

4. The method of claim 1, wherein determining a correction value includes determining a plurality of sub-range correction values.

5. The method of claim 1, further including determining a voltage sub-range of the current voltage deflector value.

6. A method of achieving high writing throughput of a particle beam lithography device, while reducing oscillation or ringing of a deflector voltage, by providing correction for deflector voltages, comprising:

determining a voltage step value by subtracting a previous deflector voltage value from a current deflector voltage value;

determining a plurality of correction values using the voltage step value and an exposure time for the current deflector voltage value;

selecting a current voltage correction value from the plurality of correction values using the current deflector voltage value; and determining a corrected deflector voltage value by adding the current voltage correction value to the current deflector voltage value.

7. The method of claim 6, wherein determining a voltage step value includes calculating the voltage step value.

8. The method of either one of claims 6 or 7, wherein determining a plurality of correction values includes providing the voltage step value and the exposure time to at least one look-up table.

9. The method of claim 8, wherein the at least one look-up table is a plurality of look-up tables, and wherein each of the look-up tables outputs one of the plurality of correction values.

10. The method of claim 9, wherein each of the look-up tables is associated with a unique sub-range of a plurality of sub-ranges of potential deflector voltage values.

11. The method of claim 10, wherein selecting a current correction value includes determining the unique subrange of the plurality of sub-ranges of potential deflector voltage values in which the current deflector voltage value is included.

12. The method of claim 11, wherein selecting a current correction value includes selecting the output of the look-up table associated with the unique sub range.

13. The method of claim 6, wherein the determining a corrected deflector voltage value includes calculating the corrected deflected voltage value.

14. A software system which supplies instructions to apparatus used to improve pattern edge resolution during exposure of a photoresist to a particle beam, wherein the software system provides correction for deflector voltages, comprising:

at least one module for determining a correction value using a previous deflector voltage value, a current deflector voltage value, and an exposure time for the current deflector voltage value; and at least one module for calculating a corrected deflector voltage value by adding the correction value to the current deflector voltage value.

15. The method of claim 14, wherein the at least one module for determining a correction value includes inputting the previous deflector voltage value, the current deflector voltage value, and the exposure time for the current deflector voltage value into at least one look-up table.

16. The method of claim 14, further including at least one module for calculating a voltage step value by subtracting the previous deflector voltage value from the current deflector voltage value.

17. The method of claim 14, wherein the at least one module for determining a correction value includes determining a plurality of sub-range correction values.

18. The method of claim 14, further including at least one module for determining a voltage sub-range of the current voltage deflector value.

19. A software system which supplies instructions to apparatus used to achieve high writing throughput of a particle beam lithography device, while reducing oscillation or ringing of a deflector voltage, wherein the software system provides correction for deflector voltages, comprising:
- at least one module for calculating a voltage step value by subtracting a previous deflector voltage value from a current deflector voltage value;
- at least one module for determining a plurality of correction values using the voltage step value and an exposure time for the current deflector voltage value;
- at least one module for selecting a current voltage correction value from the plurality of correction values using the current deflector voltage value; and
- at least one module for calculating a corrected deflector voltage value by adding the current voltage correction value to the current deflector voltage value.

20. The method of claim 19, wherein the at least one module for determining a plurality of correction values includes providing the voltage step value and the exposure time to at least one look-up table.

21. The method of claim 20, wherein the at least one look-up table is a plurality of look-up tables, and wherein each of the look-up tables outputs one of the plurality of correction values.

22. The method of claim 21, wherein each of the look-up tables is associated with a unique sub-range of a plurality of sub-ranges of potential deflector voltage values.

23. The method of claim 22, wherein the at least one module for selecting a current correction value includes determining the unique sub-range of the plurality of sub-ranges of potential deflector voltage values in which the current deflector voltage value is included.

24. The method of claim 23, wherein the at least one module for selecting a current correction value includes selecting the output of the look-up table associated with the unique sub-range.

* * * * *